United States Patent
Fujiwara et al.

(10) Patent No.: US 6,990,625 B2
(45) Date of Patent: Jan. 24, 2006

(54) BURST ERROR PATTERN GENERATION METHOD, AND BURST AND BYTE ERROR DETECTION CORRECTION APPARATUS

(75) Inventors: Eiji Fujiwara, 1-22-3-1907, Nishiwaseda, Shinjuku-ku, Tokyo 169-0051 (JP); Jiro Kinoshita, Yamanashi (JP)

(73) Assignees: Fanuc LTD, Yamanashi (JP); Eiji Fujiwara, Tokyo (JP)

( * ) Notice: Subject to any disclaimer, the term of this patent is extended or adjusted under 35 U.S.C. 154(b) by 477 days.

(21) Appl. No.: 10/166,642

(22) Filed: Jun. 12, 2002

(65) Prior Publication Data

US 2003/0023930 A1  Jan. 30, 2003

(30) Foreign Application Priority Data

Jun. 14, 2001  (JP) ............................. 2001-180455

(51) Int. Cl.
*H03M 13/03*  (2006.01)
(52) U.S. Cl. ........................ 714/788; 714/762; 714/787
(58) Field of Classification Search ................ 714/788, 714/757, 704, 755, 787, 786, 762, 752, 746
See application file for complete search history.

(56) References Cited

U.S. PATENT DOCUMENTS

| | | | |
|---|---|---|---|
| 3,478,313 A | | 11/1969 | Srinivasan |
| 3,868,632 A | * | 2/1975 | Hong et al. .................. 714/755 |
| 3,882,457 A | * | 5/1975 | En ............................... 714/788 |
| 4,539,679 A | * | 9/1985 | Bux et al. .................... 370/405 |
| 5,631,909 A | * | 5/1997 | Weng et al. ................. 714/704 |
| 5,687,181 A | * | 11/1997 | Suemura et al. ............ 714/757 |

FOREIGN PATENT DOCUMENTS

| | | |
|---|---|---|
| EP | 1 047 199 A1 | 10/2000 |
| EP | 1 047 199 A2 | 10/2000 |
| JP | 7-60394 | 6/1995 |

OTHER PUBLICATIONS

Chien, R. T., "Burst-correcting codes with high-speed decoding", IEEE Transactions on Information Theory, IEEE Inc., New York, vol. IT-15, No. 1, Jan. 1969, pp. 110-112.

* cited by examiner

*Primary Examiner*—Albert Decady
*Assistant Examiner*—Dipakkumar Gandhi
(74) *Attorney, Agent, or Firm*—Staas & Halsey LLP

(57) ABSTRACT

A syndrome S is found from a received information D and a parity check matrix for correcting burst errors up to b bits. The syndrome S is inputted to p sets of burst error pattern generation circuits that correspond to information frames overlapping each other by (b−1) bits and each having a length of 2b bits. If a burst error is included entirely in any one of the p sets of burst error pattern generation circuits, then the burst error pattern is outputted. An error pattern calculation circuit executes OR respectively on overlapping bits output from the error pattern generation circuits. By executing exclusive OR on an output of the error pattern calculation circuit and received information D, corrected information $D_s$ is obtained. As a result, a burst error in the received information can be detected and corrected.

8 Claims, 8 Drawing Sheets

(FIG. 1)
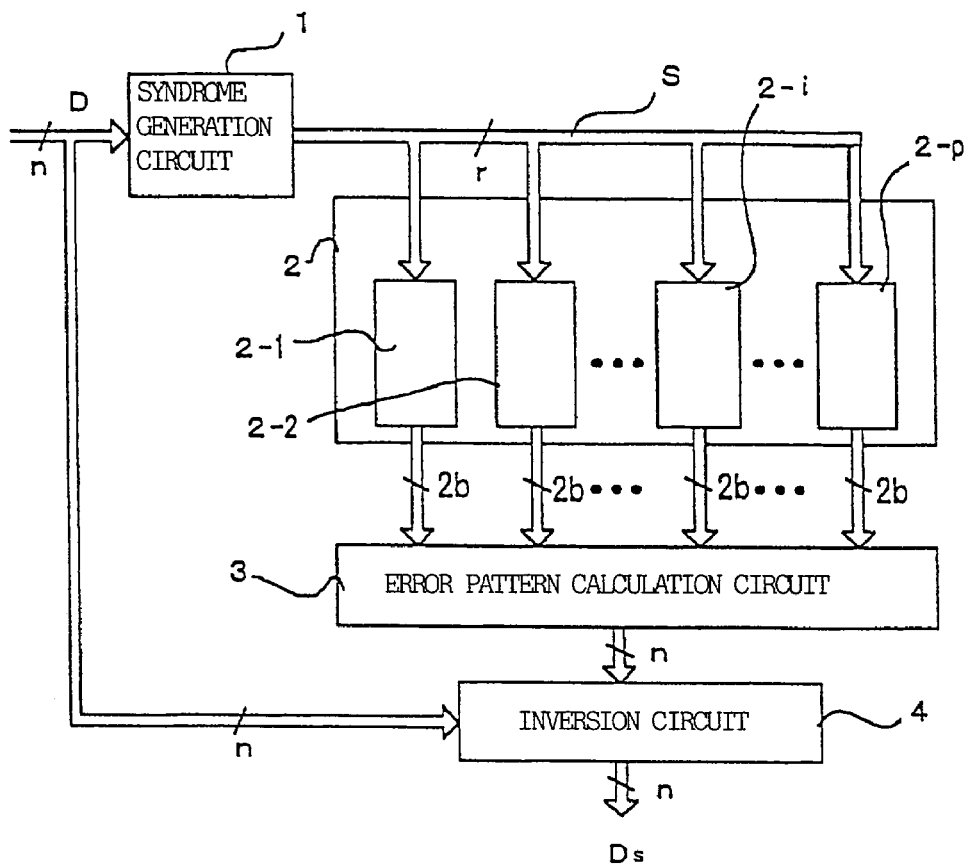
(FIG. 2)
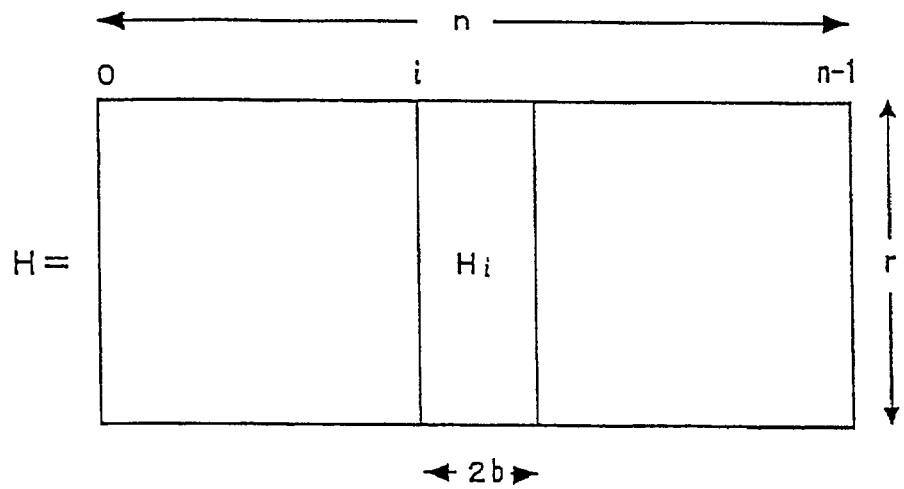

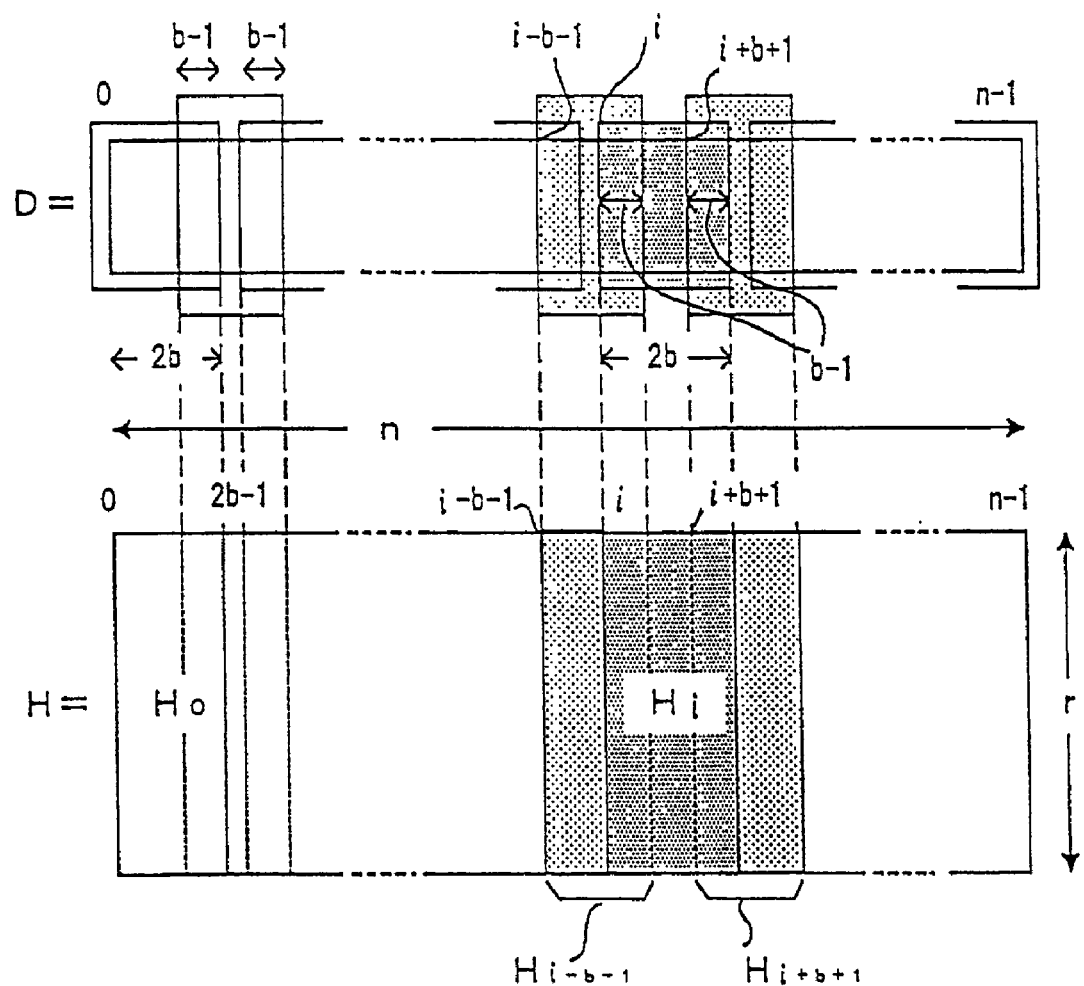
(FIG. 3)

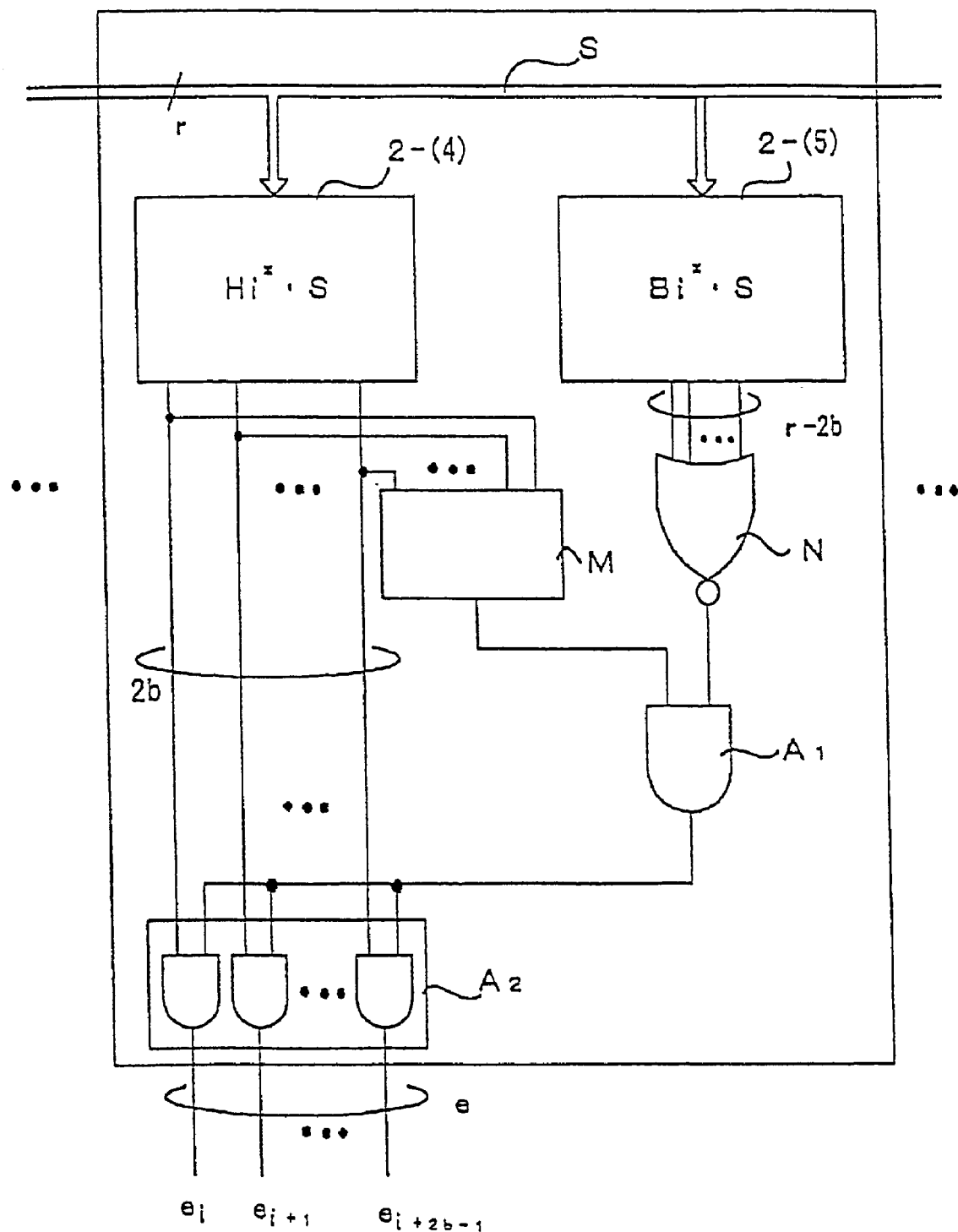
(FIG. 4)

(FIG. 5)

$$H = \begin{bmatrix} 1&0&0&0&0&1&0&0&0&1&0&0&0&0&1&0&0&0&0&1&0&0&0&0&1&0&0&0&0&1&0&0&0&0 \\ 0&1&0&0&0&0&1&0&0&0&1&0&0&0&0&1&0&0&0&0&1&0&0&0&0&1&0&0&0&0&1&0&0&0 \\ 0&0&1&0&0&0&0&1&0&0&0&1&0&0&0&0&1&0&0&0&0&1&0&0&0&0&1&0&0&0&0&1&0&0 \\ 0&0&0&1&0&0&0&0&1&0&0&0&1&0&0&0&0&1&0&0&0&0&1&0&0&0&0&1&0&0&0&0&1&0 \\ 0&0&0&0&1&0&0&0&0&1&0&0&0&1&0&0&0&0&1&0&0&0&0&1&0&0&0&0&1&0&0&0&0&1 \\ 1&0&0&1&0&1&1&1&0&0&1&0&1&1&1&0&0&1&0&1&1&1&0&0&1&0&1&1&1&0&0&1&0&1&1 \\ 0&1&0&1&1&1&0&0&1&0&1&1&1&0&0&1&0&1&1&1&0&0&1&0&1&1&1&0&0&1&0&1&1&1&0 \\ 0&0&1&0&1&1&1&0&0&1&0&1&1&1&0&0&1&0&1&1&1&0&0&1&0&1&1&1&0&0&1&0&1&1&1 \end{bmatrix}$$

$H_i$ (i=4) indicated; width 6, columns 4…9.

$$B_i = \begin{bmatrix} 0&0 \\ 0&0 \\ 0&0 \\ 0&0 \\ 0&0 \\ 1&0 \\ 0&0 \\ 0&1 \end{bmatrix}, \quad A_i = [H_i | B_i] = \begin{bmatrix} 0&1&0&0&0&0&0&0 \\ 0&0&1&0&0&0&0&0 \\ 0&0&0&1&0&0&0&0 \\ 0&0&0&0&1&0&0&0 \\ 1&0&0&0&0&1&0&0 \\ 0&1&1&1&0&0&1&0 \\ 1&1&0&0&1&0&0&0 \\ 1&1&1&0&0&1&0&1 \end{bmatrix}$$

(FIG. 6)

$$A_i^{-1} = \left[ \frac{H_i^*}{B_i^*} \right] = \begin{bmatrix} 1&0&0&1&0&0&1&0 \\ 1&0&0&0&0&0&0&0 \\ 0&1&0&0&0&0&0&0 \\ 0&0&1&0&0&0&0&0 \\ 0&0&0&1&0&0&0&0 \\ 1&0&0&1&1&0&1&0 \\ 1&1&1&0&0&1&0&0 \\ 1&1&0&0&1&0&0&1 \end{bmatrix}$$

$$H_i^* = \begin{bmatrix} 1&0&0&1&0&0&1&0 \\ 1&0&0&0&0&0&0&0 \\ 0&1&0&0&0&0&0&0 \\ 0&0&1&0&0&0&0&0 \\ 0&0&0&1&0&0&0&0 \\ 1&0&0&1&1&0&1&0 \end{bmatrix}, \quad B_i^* = \begin{bmatrix} 1&1&1&0&0&1&0&0 \\ 1&1&0&0&1&0&0&1 \end{bmatrix}$$

(FIG. 7)
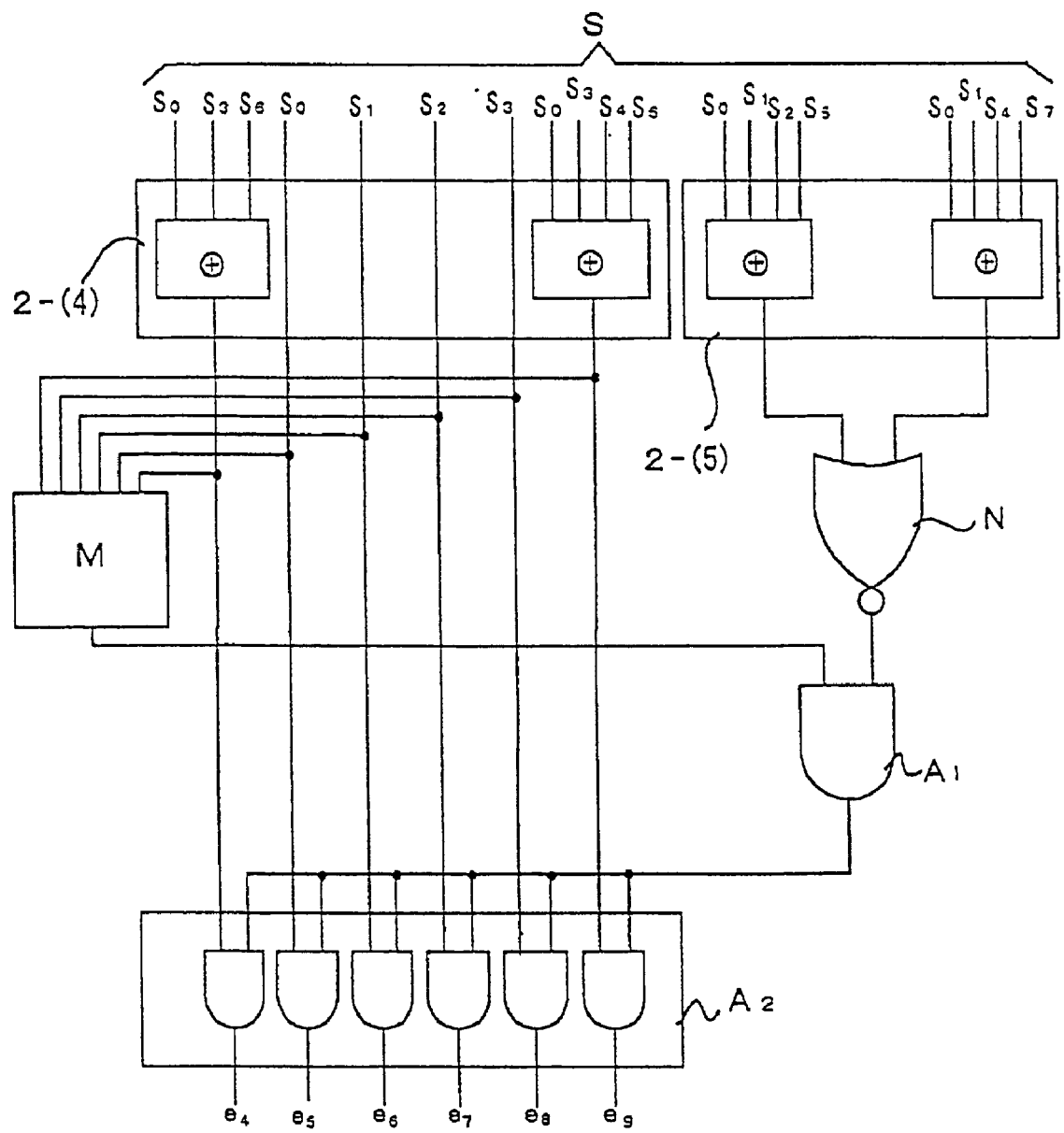

(FIG. 8)
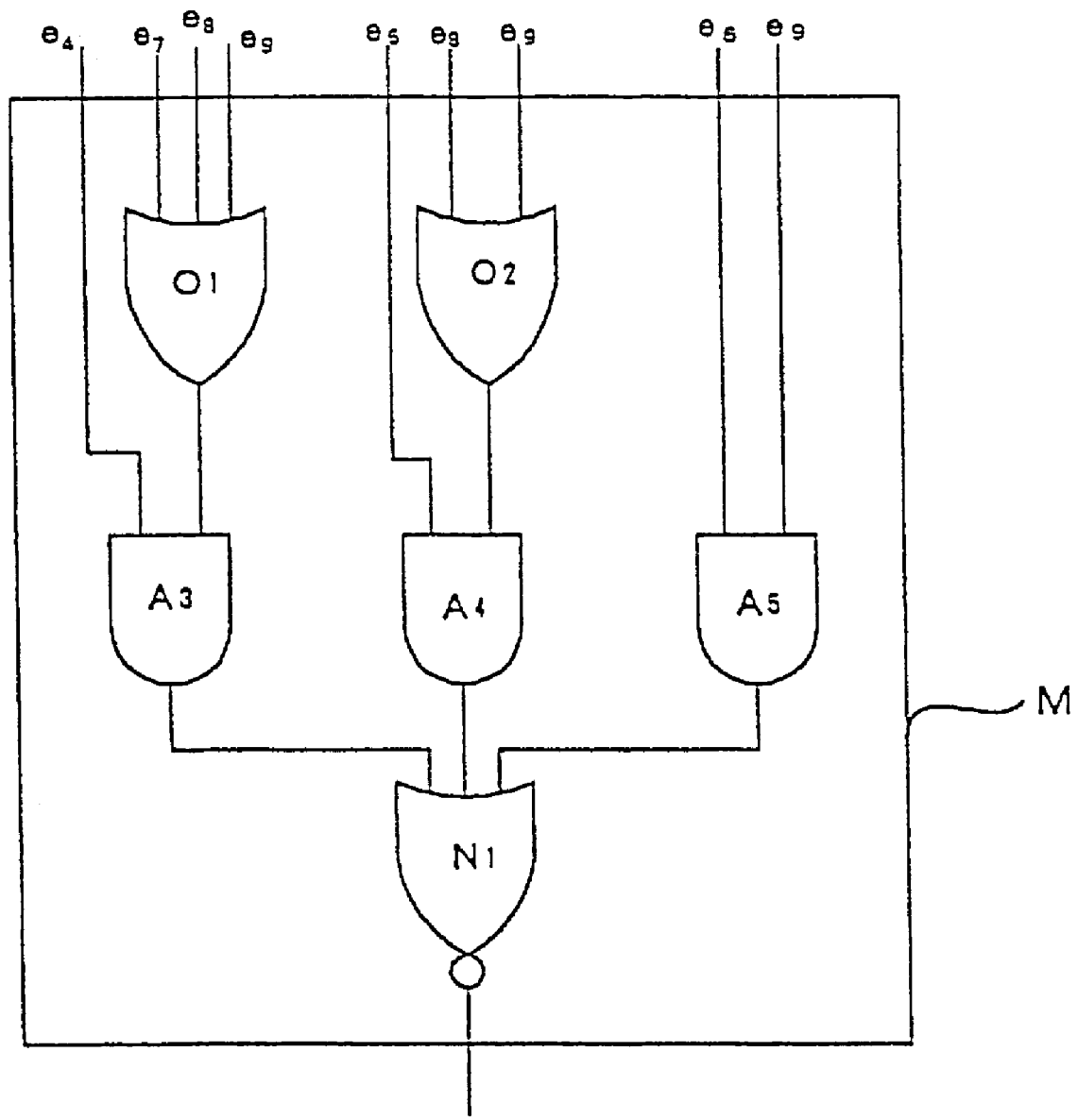

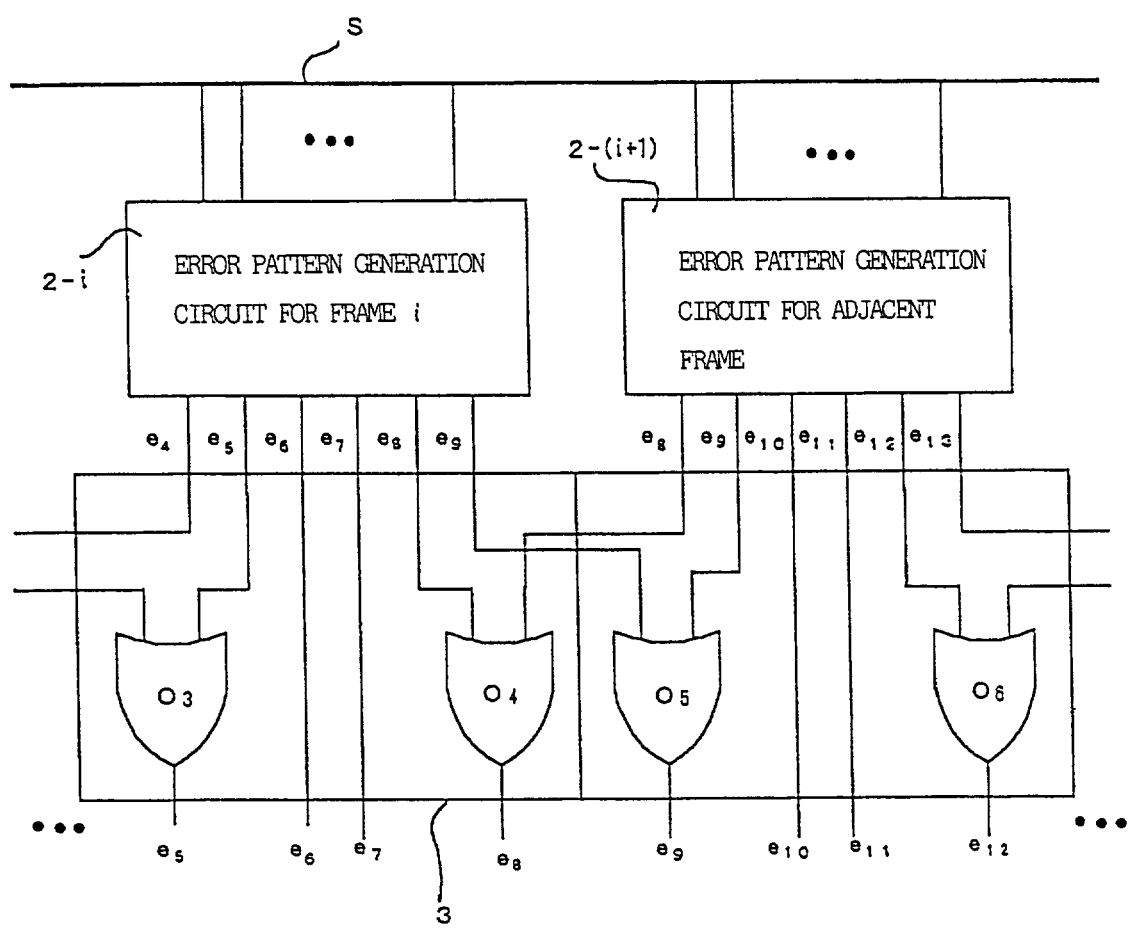
(FIG. 9)

(FIG. 10)
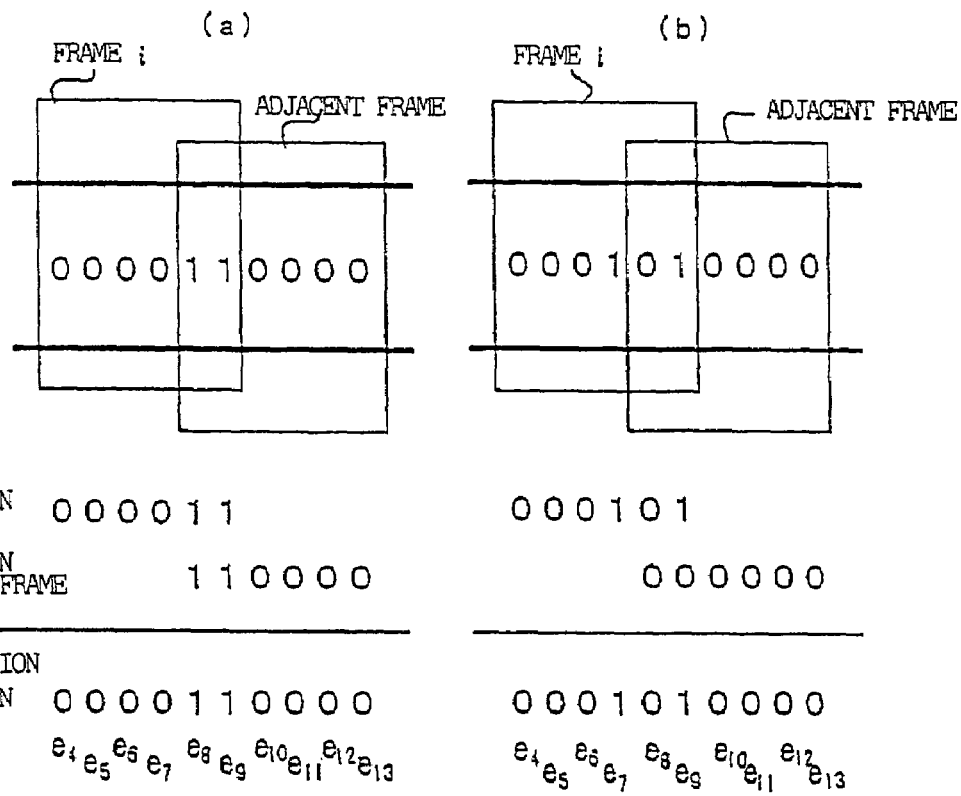

BURST ERROR PATTERN GENERATION METHOD, AND BURST AND BYTE ERROR DETECTION CORRECTION APPARATUS

BACKGROUND OF THE INVENTION

1. Field of the Invention

The present invention relates to a pattern generation method of burst errors existing in a received information, and a detection and correction apparatus for burst errors, or for byte errors which are a special form of burst errors.

2. Description of the Prior Art

In the received information stored in a continuous recording medium, such as magnetic recording or optical recording, not only random errors but also burst errors are frequently occurred. In the information communication systems used under circumstance of susceptible influence by electromagnetic noises or cosmic particles, burst errors are also dominant type of errors. In addition, the possibility that burst errors occur becomes much high in the signal communication in deep cosmos and the communication to/from the satellite.

Information transmission and reception are processed bit by bit in the conventional magnetic disks, optical disks and communication systems. That is, the information is transmitted and received sequentially in these systems. Therefore, error correction and detection should also be performed sequentially. From this viewpoint, sequential processing of error correction and detection can be performed by using linear feedback shift registers (LFSRs) defined by code generator polynomial.

It is well known that Fire code can control burst error correction and detection. This code is defined by the following generator polynomial:

$$g(X) = (X^c + 1)p(X)$$

where p(x) is an m-th degree irreducible polynomial on Galois Field GF(2). It is assumed that the period of p(x) is f. Under the condition that f is not divisible by c, where $c \geq 2b-1$ and $m \geq b$, burst errors up to length of b can be corrected. At this time, the code length n is shown as n=LCM(f, c) and the check length r becomes r=c+m, where LCM(f, c) represents the smallest common multiple of f and c. This code and its decoder circuit are described in, for example, pp. 212 to 219 of "Coding Theory" written by Hideki Imai and published by Corona Publishing Co. Ltd. in March 1990. This says, however, that the decoder circuit corrects errors sequentially, that is, performs decoding synchronously with clocks by using LFSRs prescribed by p(x) and $x^c+1$.

On the other hand, techniques for detecting and correcting random 1-bit or 2-bit errors in parallel have already been proposed and practically applied. In other words, in high speed semiconductor memory systems, 1-bit, 2-bit random errors, or single cluster of multiple-bit errors, that is, single byte errors are detected or corrected in parallel manner for information bit length of 16 bits to 128 bits read out in parallel from the memory. In this case, decoder circuit should be implemented by combinational circuits, not by LFSRs. These are described in Chapters 4 and 5 of T. R. N. Rao and E. Fujiwara, "Error Control Coding for Computer Systems," Prentice-Hall, 1989.

It is well known the technique to control the burst errors without directly using the code that has the functionality for the burst error detection and correction. In other words, in case of correcting burst errors having b-bit length included in the information having the n-bit length, the technique of interleaving with degree b can be applied. That is, it is realized by preparing b sets of functions of correcting a 1-bit error for the information having the length of n/b. The technique of interleaving is explained in p. 220 of the "Coding Theory" written by Hideki Imai and published by Corona Publishing Co. Ltd. At this time, if b sets of 1-bit error correction circuits with a parallel decoding capability can be prepared in parallel, the b-bit burst error correcting circuit in parallel manner can be performed. But, in case that the burst error length to be corrected becomes large such as several ten bits, the number of required check bits becomes extremely large, and the quantity of circuit also becomes large. From the practical viewpoint, therefore, this technique cannot be applied.

As a medium on which a three-dimensional image is stored, there is a holographic memory having a super large capacity. For example, in such a memory, not only a two-dimensional image but also a three-dimensional image can be restored by applying laser light to a holographic surface. Information of the light intensity and phase is stored in the holographic memory. The information is read out by applying the laser light to the holographic memory, and the information thus read out is stored temporarily in, for example, a plane-like CCD memory. At this time, the information is read out as each one-dimensional direction data, that is, as longitudinal direction data and as lateral direction data. In this case, the read-out operation is performed at several hundred bits to several ten thousand bits in parallel at a time, and this operation is repeated. By these repeated operations, the information stored on the CCD is read out and the original image is restored. In such a memory, generally, as the recording surface is two-dimensional, the manufacture defects, distortion and cracks in a holographic surface, and interference between the information pieces read out from the holographic memory become two-dimensionally spread plane-like faults. These two-dimensionally spread faults are restored on the CCD as well, as two-dimensional errors. In the case where information is read out from the CCD as each, one-dimensional direction data, the information including burst errors are obtained. This parallel reading action is repeated in succession. Therefore, it is evident that the burst errors included in the information obtained by reading out several hundred bits to several ten thousand bits at a time must be detected and corrected at high speed. In other words, the parallel decoding is essential.

Especially for burst errors, the parallel decoding technique has not been required so strongly. Therefore, there has not been a technique to decode a parallel received information, which has a large number of bits, in parallel by using a burst error detection and correction code such as the fire code. Thus, there is a problem that parallel decoding cannot be performed.

OBJECTS AND SUMMARY OF THE INVENTION

An object of the present invention is to provide a pattern generation method of burst errors, and a detection and correction apparatus for burst errors, or for byte errors, which are a special form of burst errors, in parallel.

According to the present invention, burst errors up to b bits can be detected and corrected in parallel for a n-bit received information D in accordance with the following steps:

(1) generating a syndrome S by applying a matrix prescribed by a code to received information D in a syndrome generation circuit;

(2) inputting the generated syndrome Sin common top sets of burst error pattern generation circuits each having an information frame of a predetermined length w;

(3) causing these p sets of burst error pattern generation circuits to determine whether there is a burst error in the pertinent received information frame having w bits length (w is an integer within b to 2b) or not;

(4) when a burst error is entirely included in any one of p sets of burst error pattern generation circuits, outputting from the pertinent burst error pattern generation circuit a burst error pattern, while when a burst error is included in adjacent two burst error pattern generation circuits overlapping with each other, outputting from the pertinent burst error pattern calculation circuits a burst error pattern having no contradiction as a whole;

(5) executing exclusive OR between respective bits of the error pattern generated by a error pattern calculation circuit and corresponding bits of the received information D inputted, and outputting corrected information Ds of n bits length; and (6) expressing the received information by n bits binary information in which r bits check information determined by codes are included, wherein if a code for correcting burst errors can be expressed by a H parity check matrix having r rows by n columns, $$H \cdot D^T = 0_r$$

is established for the received information D (n-th row vector) where no error is included. In the above equation, $D^T$ is a column vector obtained by transposing the row vector D.

On the other hand, if the burst error has occurred in the received information D, $$H \cdot D^T = 0_r$$

is not established. This result is called syndrome S.

In other words, if $S=0_r$, then it is judged that there are no errors, while if $S \neq 0_r$, then it is judged that there are errors. Subsequently, the analysis is effected based on the pattern of the syndrome S to find a burst error pattern and its beginning position, and the received information D is corrected.

BRIEF DESCRIPTION OF THE DRAWINGS

The other objects and features of the said invention will become apparent from the following description of the preferred embodiments of the invention with reference to the accompanying drawings, in which:

FIG. 1 is a block diagram of a burst error parallel decoder circuit included in a burst and byte error detection and correction apparatus of an embodiment according to the present invention;

FIG. 2 is a diagram showing a code matrix having r rows by n columns representing a code, and a partial matrix $H_i$ having r rows by 2b columns and beginning with an i-th bit of the code matrix;

FIG. 3 is a diagram showing how each information frames with length of 2b bits are set in n-bit received information and partial matrixes of the H matrix are taken in association with these frames;

FIG. 4 is a block diagram of a burst error pattern generation circuit for a certain frame included in a burst error pattern generation circuit 2 of FIG. 1 in an embodiment according to the present invention;

FIG. 5 is a diagram showing an H matrix of a 3-bit burst error correction fire code for a received information having length of 35 bits, consisting of an information section having length of 27 bits and a check section having length of 8 bits, as an embodiment of the present invention, in which a matrix $B_i$ obtained when a partial matrix having length of 6 bits beginning with a fourth bit is set as $H_i$, and a nonsingular matrix $A_i$ formed by adding the $B_i$ to the $H_i$ are shown;

FIG. 6 is a diagram showing an inverse matrix $A_i^{-1}$ for the nonsingular matrix $A_i$ and its partial matrixes $H_i^*$ and $B_i^*$;

FIG. 7 is a diagram showing a burst error pattern generation circuit of a frame corresponding to the partial matrix Hi (i.e., corresponding to an information frame that begins with a fourth bit);

FIG. 8 is a detailed circuit diagram of a circuit M shown in FIG. 7;

FIG. 9 is a diagram showing an error pattern calculation circuit in the embodiment; and FIG. 10(a) is a diagram showing the case where an error in the embodiment occurs in a region that overlaps with the adjacent frame. FIG. 10(b) is a diagram showing the case where an error drops out of the region, but is included entirely in one frame.

DETAILED DESCRIPTION OF THE PREFERRED EMBODIMENTS

When the burst error having the length of b bits or less exists in the received information having the length of n bits, in order to correct this error, it is necessary to find the error pattern of b bits or less, and also to find the information as to the bit position with which the burst error begins in the received information. For conducting decoding in parallel, it is necessary to find the error pattern and the bit position in which the error has occurred, by forming the combinational circuit from the received n-bit information (including check bits required for burst error correction) and by conducting parallel processing. Therefore, there is demanded a technique of conducting decoding on the basis of an idea entirely different from the conventional idea.

At present, the fire code exists as a code which can detect and correct burst errors having an arbitrary length. In the present invention, however, any linear code may be used so long as it can detect and correct burst errors of b bits or less in length. In other words, a technique according to the present invention can be applied to any burst error detection and correction code so long as the code is a linear code which can represent by a parity check matrix.

FIG. 1 is a block diagram of a decoder circuit for detecting and correcting burst errors up to b bits in parallel in an embodiment according to the present invention. In FIG. 1, a circuit 1 is a syndrome generation circuit. A syndrome S is generated by applying a matrix prescribed by a code to received information D. The syndrome S is inputted to a burst error pattern generation circuit 2.

The syndrome S is commonly inputted to p sets of burst error pattern generation circuits 2-1 to 2-p having the information frame of the predetermined length w. Each of the burst error pattern generation circuits 2-1 to 2-p determines whether there are burst errors in the pertinent received information frame having the length of w bits or not. Although w is an arbitrary integer in the range $b \leq w \leq 2b$, it is supposed that w=2b in the ensuing description. When the burst errors are entirely included in any of the information frames, the pertinent one of the burst error pattern generation circuits 2-1 to 2-$p$ outputs a correct burst error pattern.

A circuit 3 is an error pattern calculation circuit for calculating an error pattern that has no contradictions as a whole, when burst errors overlap in the adjacent received information frame. A circuit 4 is an inversion circuit for executing exclusive-OR between respective bits of the error pattern generated ("1" is outputted for an error bit) by the error pattern calculation circuit 3 and corresponding bits of the received information inputted. If an error indicating bit in the error pattern is "1", the input bit is inverted and thereby corrected. Therefore, the inversion circuit 4 is formed of n sets of two-input exclusive-OR circuits arranged in parallel. From the inversion circuit 4, n-bit corrected information Ds is outputted. However, in the case where the check information is not used in subsequent processing, the inversion circuit 4 can be formed only exclusive-OR circuits corresponding to k (=n−r) bits that form an information section.

When the received information is typically represented by n-bit binary information and an n-th row vector $D=(d_0, d_1, \ldots, d_{n-1})$ is formed, it includes check information of r bits determined by the code. In general, the code is expressed by a parity check matrix H (hereafter referred to as H matrix) having r rows by n columns of elements each represented by a binary number of 0 and 1. It is now supposed that a code for correcting burst errors can be expressed by the H matrix having r rows by n columns. At this time, the following relation is satisfied for received information D that does not include errors. In other words, the check information is previously determined so that the received information D will satisfy the following relation:

$$H \cdot D^T = 0_r \quad (1)$$

where $D^T$ is a column vector obtained by transposing the row vector. T represents transposition between a row and a column. In the case where burst errors have occurred in the received information D at this time, the right side of the equation (1) does not become 0r (0 vector formed of r bits). This result is called syndrome S, and represented by a column vector formed of r bits. In other words, if $S=0_r$, then it is judged that there are no errors. If $S \neq 0_r$, then the analysis is performed based on the pattern of the syndrome S to find the burst error pattern and its beginning position, and as a result correction is performed. The syndrome generation circuit 1 in FIG. 1 is a circuit for calculating the left side of the equation (1), and it is formed of r parity check circuits. Its output becomes an r-bit syndrome S.

In the H matrix of r rows by n columns for correcting a burst error of b bits or less, a partial matrix of r rows by 2b columns having length of 2b bits and beginning with an arbitrary position (for example, an i-th bit) is denoted by $H_i$, where $2b \leq r$. This partial matrix has a rank r, and 2b column vectors are linearly independent. In other words, a linear sum of 2b column vectors is always non-zero. A partial matrix having r rows by (r−2b) columns is referred to as $B_i$. The $B_i$ is disposed so as to be adjacent to the $H_i$, and thereby a square matrix having r rows by r columns $A_i=[H_i|B_i]$ is newly created. At this time, $B_i$ is formed so as to make Ai a nonsingular matrix. "Nonsingular matrix" is defined as a matrix that is not zero in determinant value. Therefore, a nonsingular matrix certainly has an inverse matrix, which is uniquely determined. In other words, the following equation is satisfied, $$A_i^{-1} \cdot A_i = I$$

where I is the binary identity matrix having r rows by r columns. Therefore, $A_i^{-1}$ is represented by the following equation, $$A_i^{-1} = \begin{bmatrix} H_i^* \\ B_i^* \end{bmatrix}$$

where $H_i^*$ is a matrix having 2b rows by r columns, and $B_i^*$ is a matrix having (r−2b) rows by r columns. At this time, the following relations are satisfied.

$$H_i^* \cdot H_i = I_{2b}$$

$$B_i^* \cdot H_i = 0_{r-2b}$$

$$H_i^* \cdot B_i = 0_{2b}$$

$$B_i^* \cdot H_i = I_{r-2b} \quad (2)$$

where $I_{2b}$ and $I_{r-2b}$ are binary identity matrixes having 2b rows by 2b columns and (r−2b) rows by (r−2b) columns, respectively, and $0_{2b}$ and $0_{r-2b}$ are binary all zero matrixes having 2b rows by 2b columns and (r−2b) rows by (r−2b) columns, respectively. On the other hand, $B_i$ is not determined uniquely for Hi. However, it is desirable to select $B_i$ so as to make the total number of "1" in $B_i^*$ and $H_i^*$ as a smallest value when considering the circuit quantity of the decoder circuit.

If a b-bit burst error included in a frame having the length of 2b bits and beginning with an i-th bit is superimposed on the n-bit errorless information $D_o$, then received information D can be represented as $D=D_o+E$, where E is an n-bit error pattern row vector. At this time, a syndrome S, which is a column vector of r bits, can be represented by the following equation.

$$\begin{aligned} S &= H \cdot D^T \\ &= H \cdot D_0^T + H \cdot E^T \\ &= H \cdot E^T \end{aligned} \quad (3)$$

In other words, for the errorless information $D_0$, it follows that $H \cdot D_0^T = 0r$. Therefore, the syndrome S becomes equal to $H \cdot E^T$. At this time, the error pattern E includes a burst error e beginning with an i-th bit thereof, and the error pattern E can be represented as follows, $$E = (\underset{0}{0}, 0, \ldots \underset{i}{e}, 0, \underset{n-1}{\cdots 0})$$
$$\underbrace{\phantom{xxxxxxx}}_{n \leftarrow 2b \rightarrow}$$

where e is a two-element row vector that is 2b in degree. Therefore, the equation (3) can be modified as represented by the following equation. From the equation, e can be derived by using the equation (2).

$$\begin{aligned} S &= H \cdot E^T \\ &= Hi \cdot e^T \end{aligned}$$

-continued $$H_i^* \cdot S = H_i^* \cdot (H_i \cdot e^T) = e^T \quad (4)$$

$$B_i^* \cdot S = B_i^* \cdot (H_i \cdot e^T) = 0_{r-2b} \quad (5)$$

In the equation (5), $0_{r-2b}$ is a zero column vector of (r−2b)th order. In other words, when $B_i^* \cdot S$ is a zero vector from the equation (5), e is obtained from $H_i^* \cdot S$ in the equation (4). If $B_i^* \cdot S$ is not zero for non-zero syndrome S, then an error that exceeds the correction capability has occurred and e cannot be obtained correctly from the equation (4).

As heretofore described, a burst error pattern of up to b bits in 2b bits can be derived by using the equations (4) and (5).

A technique for finding the beginning position of burst errors will now be described. In the foregoing description, it has been supposed that the error begins with the i-th bit. However, it is necessary to show the method for obtaining the position. First, in the received information, a certain information frame having the length of 2b is supposed as shown in FIG. 3. On the left side and the right side thereof, frames having the same length are sequentially formed so as to cause overlapping of the length of (b−1). Except the first and last frames, two of the lengths (b−1) included in each frame are overlapped with the both(left and right) adjacent frames. (The last frame might have a length shorter than 2b.) In each frame, only two central bits are not overlapped. By doing so, the b-bit burst errors, which have occurred in an arbitrary position, is entirely included at least in one frame. If the burst errors are less than b bits, the burst errors are included entirely in one frame, and in some cases they are also included entirely in the next adjacent frame. However, the b-bit burst errors are entirely included only in one frame, but they are not included entirely in the adjacent frame as well. At this time, there exists one frame that includes a part of the burst error. As for the burst errors of (b+1) bits or more, a frame that entirely includes the burst error does not exist, and a part of the burst error is included in each of two adjacent frames.

Subsequently, the frame width 2b is associated with the column width 2b of the partial matrix of the H matrix described earlier. In other words, $H_i$ is associated with a certain information frame having the length of 2b and beginning with an i-th bit, and the both adjacent frame of $H_i$ is associated with the partial matrixes $H_{i-b-1}$ and $H_{i+b+1}$ each having 2b columns with the overlapping of the length of (b−1). In this way, with respect to a certain information frame having the length of 2b in the received information, two adjacent information frames are supposed. These two information frames are overlapped with the certain information frame respectively on the left side and the right side each by the length of (b−1) and each having the length of 2b in the same way. Except the first and the last frame, frames having such overlapping are sequentially supposed in the same way. (Each of the first and the last frames overlaps with only one frame.) A received information frame having the length of 2b is associated with a partial matrix having r rows by 2b columns in one-to-one correspondence, and decoding is performed. In other words, as shown in FIG. 1, $H \cdot D^T$ is first calculated from the received information D having the length of n and the syndrome S is obtained. Subsequently, the equation (4) and (5) are calculated for each information frame. As many circuits for calculating the two equations as the number of frames are provided. Only for the reception frame that entirely includes b-bit burst errors, an error pattern e is correctly outputted. From the frame that includes a part of the error, a zero vector is outputted as an error pattern. The number p of frames for calculating the equation (4) and (5) is obtained by the following equation, $$P = \lceil (n-2b)/(b+1) \rceil + 1$$

Where $\lceil (n-2b)/(b+1) \rceil$ represents a minimum integer that exceeds $(n-2b)/(b+1)$. In other words, p sets of combinational circuits 2-1 to 2-$p$ shown in FIG. 1 for calculating the equations (4) and (5) are provided in parallel. A correct error pattern is outputted only from the circuit corresponding to a frame that include entirely burst errors. The burst errors which are less than b bits are included entirely in two adjacent frames in some cases. Error patterns corresponding to both frames are outputted from burst error pattern generation circuits of both frames, and adjusted in the error pattern calculation circuit 3. A correct error pattern is outputted.

FIG. 4 shows an intra-frame burst error generation circuit, which outputs an error pattern when there are burst errors of b bits or less in a range between an i-th bit and (i+2b−1)th bit, which corresponds to an information frame having the lengths of 2b bits and beginning with the i-th bit.

The circuit in FIG. 4 includes the followings.

a combinational circuit 2-(4) for calculating the equation (4), a combinational circuit 2-(5) for calculating the equation (5), a circuit M for outputting "1" by using an output of the circuit 2-(4) if the errors are the burst errors that are included entirely in the frame and that are b bits or less, and for outputting "0" otherwise, a NOR gate N for outputting "1" when all of outputs of (r−2b) bits of the circuit 2-(5) are "0", a two-input AND gate $A_1$, and a group $A_2$ of 2b two-input AND gates At this time, the AND gate $A_1$ is a circuit for outputting "1" when the equation (5) is satisfied and the burst errors of b bits or less are included entirely in the frame.

Finally, when the output of the gate $A_1$ is "1", the error pattern e created according to the equation (4), i.e., the output of the circuit 2-(4), becomes a correct burst error pattern, and outputs of the 2b sets of AND gates $A_2$ correspond thereto. This output is inputted to the inversion circuit 4 via the error pattern calculation circuit 3 of n bits shown in FIG. 1, and the corrected information is obtained. On the other hand, the circuit M shown in FIG. 4 can be formed by the following logical expression for the error pattern of 2b bits beginning with ei, $$\bigcup_{k=i}^{i+b-1} \left( e_k \cap \overline{\left( \bigcup_{j=k+b}^{i+2b-1} \cdot e_j \right)} \right) \quad (6)$$

where $\cup$ indicates a logical sum, $\cap$ indicates a logical product, and a line drawn above the expression means a logical NOT. In other words, $\overline{X}$ is a logical NOT of X. Furthermore, $$\bigcup_{t=u}^{v} e_t$$

indicates $e_u \cup e_{u+1} \cup \ldots \cup e_{v-1} \cup e_v$ for u<v.

If the burst error length is (b−1) bits or less, then the burst errors might be included entirely in both of two adjacent information frames having the overlapping of (b−1) bits. Therefore, the error pattern calculation circuit 3 executes OR (logical sum functions) between (b−1) outputs at each of both ends of each of the error pattern generation circuits 2-1 to 2-$p$ and (b−1) corresponding outputs at an end of an adjacent error pattern generation circuit, respectively. In other words, the error pattern calculation circuit 3 executes OR between overlapping portions.

The inversion circuit 4 executes exclusive-OR between n bits of the received information D and n bits supplied from the error pattern calculation circuit 3, respectively. The inversion circuit 4 includes n exclusive-OR gates arranged independently. Corresponding bits of the received information D and the error pattern calculation circuit 3 are inputted to each of the exclusive-OR gates. It is now supposed that "1" is outputted from the error pattern calculation circuit 3. If the corresponding bit of the received information D is "1", then "0" is outputted. If the corresponding bit of the received information D is "0", then "1" is outputted. In this way, the bit of the received information D is inverted, corrected and outputted. As for an errorless bit, "0" is outputted from the error pattern calculation circuit 3. As for an errorless bit, therefore, the received information D is outputted as it is. This is outputted as corrected information $D_s$.

Generally, as for the code which can correct the burst errors up to b bits and can detect the burst errors up to d (>b) bits, the frame length w should be an arbitrary integer value that satisfies the relation b≦w≦b+d and the circuit is basically the same as the circuit shown in FIG. 1. However, it is necessary to add a circuit for detecting burst errors up to d bits. This error can be detected when the syndrome S is not zero and the error pattern $E=0_n$. A circuit that satisfies this logic should be prepared. $E=0_n$ means that all of the n-bit error patterns are "0".

In foregoing and ensuing embodiments, only decoding processing is described. If the logic of decoding is expressed clearly, however, it is self-evident that encoding processing can be formed in conformity thereto.

By using one example, it will now be shown concretely that the burst error can be corrected in parallel. FIG. 5 shows an example of an H matrix of a (35, 27) 3-bit burst error correction fire code. At this time, it follows that b=3, n=35 and r=8. It is now supposed that a partial matrix of an H matrix that corresponds to a frame having the length of 2b (=6) bits and beginning with an i=4th bit is $H_i$ (i=4 in the case of this example) shown in FIG. 5. This $H_i$ is a matrix having 8 rows by 6 columns. By adding a matrix $B_i$ having 8 rows by 2 columns thereto, a nonsingular matrix $A_i$ having 8 rows by 8 columns is created. FIG. 5 shows these matrixes as well. FIG. 6 shows an inverse matrix $A_i^{-1}$. FIG. 6 shows a matrix $H_i^*$ having 6 rows by 8 columns and a matrix $B_i$ having 2 rows by 8 columns as well.

FIG. 7 shows a concrete configuration of FIG. 4 in the case of this example. A parallel burst error decoder circuit for an information frame beginning with a 4th bit is shown. First, it is supposed that the following error has occurred as a burst error pattern up to 3 bits.

$$E = (0000\ \overset{4\ \ldots\ 9}{\underset{e}{101000}}\ 0000\ldots 00)$$

A frame for this example is a received information frame having a length of 2b=6 bits and beginning with a 4th bit. A syndrome S for the 3-bit burst error is obtained by:

$$S = H \cdot E^T = (01001110)$$

Since $S=(S_0, S_1, S_2, S_3, S_4, S_5, S_6, S_7)$, a circuit 2-(4) for calculating $H_i^* \cdot S$ can be formed from a logic of:

$$(S_0 \oplus S_3 \oplus S_6, S_0, S_1, S_2, S_3, S_0 \oplus S_3 \oplus S_4 \oplus S_6)^T$$

where ⊕ represents exclusive OR

For the supposed error, substituting $S_0=0$, $S_1=1$, $S_2=0$, $S_3=0$, $S_4=1$, $S_5=1$, $S_6=1$, and $S_7=0$ into the expression, $$H_i^* \cdot S = (101000)^T$$

is obtained

On the other hand, a circuit 2-(5) for calculating $B_i^* \cdot S$ can be formed from a logic of:

$$(S_0 \oplus S_1 \oplus S_2 \oplus S_5, S_0 \oplus S_1 \oplus S_4 \oplus S_7)^T$$

By substituting $S_0=0$, $S_1=1$, $S_2=0$, $S_4=1$, $S_5=1$, and $S_7=0$ into the expression, $$B_i^* \cdot S = (00)^T$$

is obtained.

FIG. 8 shows a circuit M concretely formed for this example. In other words, this circuit is a circuit indicating that an error is included entirely in a frame having a length of 6 bits and beginning with a 4th bit, and the burst errors having the length of at least 4 bits does not exist. When such an error does not exist, the circuit M outputs "1". As for the logic, representing an error pattern e corresponding to the frame by $$e = (e_4, e_5, e_6, e_7, e_8, e_9)$$

and substituting it into the expression (6), $$\overline{(e_4 \cap (e_7 \cup e_8 \cup e_9)) \cup (e_5 \cap (e_8 \cup e_9)) \cup (e_6 \cap e_9)}$$

is obtained.

This circuit M becomes a logical circuit shown in FIG. 8. In FIG. 8, $O_1$ and $O_2$ denote OR gates, $A_3$, $A_4$ and $A_5$ dente AND gates, and $N_1$ denotes NOR gate. In short, for example, the burst errors having the length of at least 4 bits and beginning with $e_4$ are the case where $e_4$ is "1" and $e_7$, $e_8$ or $e_9$ is "1". If such a case does not occur, the burst errors having the length of at least 4 bits and beginning with $e_4$ does not exist. For the burst errors beginning with $e_5$ and for the burst errors beginning with $e_6$ as well, logics can be obtained in the same way.

Since the previously supposed 3-bit burst errors are included entirely in the information frame beginning with a 4th bit, the gate N in FIG. 7 outputs "1". Since the burst errors having the length that exceeds 4 bits do not exist, the circuit M also outputs "1". Since both conditions are satisfied, therefore, the two-input AND gate $A_1$ outputs "1". In addition, an error pattern output from the circuit 2-(4) is a correct error pattern, the two-input AND gate group $A_2$ outputs a 6-bit error pattern signal of $e_4$, $e_5$, $e_6$, $e_7$, $e_8$ and $e_9$.

The error pattern calculation circuit (the circuit 3 in FIG. 1) for this example will now be described.

It is necessary to rearrange 2b-bit error patterns respectively outputted from p burst error pattern generation circuits so as to correspond to overlapping of information frames, and finally form an n-bit error pattern corresponding to n bits of the received information in one-to-one correspondence. Especially when the burst errors have the length of (b−1) bits or less, the burst errors are included entirely in both of two adjacent information frames having the overlapping of (b−1) bits. As shown in FIG. 9, therefore, it is necessary to execute OR (logical sum) between (b−1) outputs at each of both ends of each error pattern generation circuit corresponding to a frame and the overlapped (b−1) outputs at the end of its adjacent error pattern generation circuit, respectively. Since b=3 in this example, two outputs located at both ends are inputted to two-input OR gates ($O_3$, $O_4$, $O_5$ and $O_6$).

On the other hand, if the error has at least b bits, at least one of two overlapping information frames does not include the error entirely, but includes only a part of the error. Therefore, a generation circuit corresponding to the frame outputs an all-zero pattern as the error pattern. By executing OR between (b−1) bits at respective ends, the correct error pattern is obtained. In this way, the error pattern calculation circuit 3 outputs an n-bit (35-bit in this example) error pattern.

FIG. 10 is a diagram showing operation of the error pattern calculation circuit 3. FIG. 10(a) shows the case where the error is included entirely in both of two frames. FIG. 10(b) shows the case where the error is included entirely in one frame (i), but the error is not included entirely in the adjacent frame. As shown, the correct error pattern is outputted by executing OR between overlapping bits.

As described with reference to FIG. 1, the inversion circuit is a circuit for executing exclusive-OR between the received information D and bits of the corresponding error pattern. The inversion circuit can be formed by arranging n (n=35, in this example) exclusive-OR gates independently. In other words, for the bit in which the error is detected, the error pattern calculation circuit 3 outputs "1". If the corresponding bit of the received information D is "1", "0" is outputted. If the corresponding bit of the received information D is "0", "1" is outputted. In this way, the corresponding bits of the received information D are inverted for correction, and outputted. For the bit which is judged as the correct one, the error pattern calculation circuit 3 outputs "0". For this errorless bit, therefore, the corresponding bits of received information D are outputted as it is. This is outputted as the corrected information Ds.

Up to this point, the burst errors have been described as a subject of the present invention. However, it is evident that the present invention can be applied to detection and correction of byte errors, which are special forms of burst errors. When b bits form one byte, one-byte error can be corrected by using the present invention. Especially if the elements on a Galois field GF ($2^b$) are not used as the elements forming the H matrix, however, it is typically difficult to form the logic to perform the parallel decoding. For example, in a code having a function of one-byte error correction and (one-byte+one-bit) error detection described in pp. 105 to 109 of IEEE Transaction on Computers, Vol. 46, No. 1, 1997, the code is not formed by using the elements on the GF ($2^b$). Therefore, it is difficult to correct one-byte error in parallel with a small circuit quantity. At this time, by applying the present invention, the parallel decoding can be performed easily. When one byte is composed in b bits, in the code for correcting one-byte error, the size of the above described frame need not be 2b, but the size of the frame may be b. This is because a start position of the byte error basically takes b as the unit and frames including an error do not overlap each other. Therefore, the above described frame overlap having a size of (b−1) also becomes unnecessary. By appropriately selecting the added matrix $B_i^*$, therefore, it is effective to make the circuit quantity for decoding small.

Heretofore, there have been no techniques for conducting encoding and decoding in parallel by using a burst error detection and correction code. The present invention conducts encoding and decoding in parallel by using a combinational circuit, without using an LFSR which has been used for the burst error control code. For the application to require the encoding processing in high speed, therefore, the present invention can bring about a very remarkable effect. In addition, the present invention can bring about an effect that it can be applied to any burst error detection and correction code so long as the code is a linear code.

In the parallel decoding technique described here, the size of each information frame is set to 2b. The size of 2b is determined because at least arbitrary 2b columns of the H matrix must be linearly independent in order to be able to correct b-bit burst error. Therefore, the frame size is 2b at the maximum, and b at the minimum. The size may be set to a value between 2b and b. Irrespective of the frame size, however, it remains that overlap with each of frames located on both sides has a size of (b−1). As the frame size is made small, therefore, the total number of frames required as a whole increases, and the decoder circuit becomes large in proportion to this. Accordingly, it is effective in reducing the circuit quantity to set the frame size equal to 2b.

The present invention can be applied to detection and correction for byte errors as well. As a result, parallel decoding can be conducted easily and the circuit quantity can be made small.

What is claimed is:

1. A computer-readable storage storing a program for controlling a computer to generate a burst error pattern by:

defining an error row vector e in an error pattern E, said error row vector e beginning with an i-th bit of the error pattern E and having length of w bits (where w is an integer satisfying a relation b≦w≦2b<r) in a parity check matrix H (having r rows by n columns) of a linear code for correcting burst errors up to b bits in length, when the error pattern E (an n-bit row vector) is superposed on received information D having length of n bits, and when an error is a burst error having length of b bits or less and beginning with an i-th bit of the received information;

when a syndrome S (an r-bit column vector) is expressed as $$S = H_i e^T$$

(where T represents row-column transposition)

from an r-row by w-column partial matrix $H_i$ beginning with an ith column and having w columns in the matrix H, defining an r-row by (r−w) column matrix $B_i$ so as to form an r-row by r-column nonsingular matrix $A_i$ by adding to the said partial matrix $H_i$; and obtaining an error vector e from $$e^T = H_i^* \cdot S,$$

under a condition satisfying a relation $B_i^* \cdot S = 0_{r-w}$ (where $0_{r-w}$ is a zero column vector having (r−w) bits) and making a w-row by r-column matrix $H_i^*$ and an (r−w)-row by r-column matrix $B_i^*$ satisfying a relation $A_i^{-1} \cdot A^i = I$ (where I is a binary identity matrix having r rows by r columns), when expressing an inverse matrix $A_i^{-1}$ of $A_i = [H_i | B_i]$ as $$A_i^{-1} = \left[\frac{H_i^*}{B_i^*}\right]$$

thereby generating a burst error pattern having a length up to b bits.

2. A burst error detection and correction apparatus for detecting and correcting a burst error having length of up to b bits, said burst error detection and correction apparatus comprising:

a syndrome generation circuit for generating a syndrome S by using a relation $H \cdot D^T$ for received information D having length of n bits and a parity check matrix H having r rows by n columns;

error pattern generation circuits, arranged in parallel, as many as a number of all frames, in which an r-row by (r−w) column matrix $B_i$ is obtained so as to form an r-row by r-column nonsingular matrix $A_i$ by adding to an r-row by w-column partial matrix Hi beginning with an arbitrary ith column and having length of w columns (where w is an integer satisfying a relation b≦w≦2b<r) in the parity check matrix H, an inverse matrix $A_i^{-1}$ of $A_i$=[Hi|Bi] is expressed as $$A_i^{-1} = \left[\frac{H_i^*}{B_i^*}\right],$$

an information frame having length of w bits is formed in the received information, adjacent information frames each having length of w bits is sequentially formed on both sides of the information frame so as to have overlap of (b−1) bits in length, thereby an error having length of b bits occurring in an arbitrary position being able to be included entirely in at least one frame, an r-row by w-column partial matrix $H_i$ beginning with an i-th column and having length of w columns in the matrix H is associated with a certain arbitrary frame beginning with an i-th bit, an error pattern satisfying a relation $e^T = H_i^* \cdot S$ under a condition of $B_i^* \cdot S = 0_{r-w}$ is generated in each of said error pattern generation circuits by using a w-row by r-column matrix Hi* and an (r−w) row by r column matrix $B_i^*$ included in the inverse matrix $A_i^{-1}$ and the syndrome S;

an error pattern calculation circuit for adjusting overlap on outputs of said error pattern generation circuits, which outputs a signal having length of n bits corresponding to the length of n bits of the received information; and an inversion circuit for executing exclusive-OR between the outputs of the error pattern calculation circuit and the received information, and thereby inverting error bits.

3. The burst error detection and correction apparatus according to claim 2, wherein for a code capable of correcting a burst error up to b bits and detecting a burst error up to d bits greater than the b bits, said error pattern generation circuits are formed to correct a burst error up to b bits by setting the length w of each frame equal to an integer value satisfying a relation b≦w≦b+d<r and setting the overlap between frames equal to (b−1), and a circuit for outputting "1" when the syndrome is not zero and all outputs of said error pattern calculation circuit are zero is newly provided to detect a burst error up to d bits, and thereby burst errors up to b bits can be corrected and burst errors up to d bits can be detected.

4. The burst error detection and correction apparatus according to claim 2 or 3, wherein in a w-row by r-column matrix $H_i^*$ and an (r−w)-row by r-column matrix $B_i^*$ represented by two-value elements "0" and "1" forming an inverse matrix $A_i^{-1}$ of a nonsingular matrix $A_i$=[$H_i|B_i$], a number of "1"s in the $H_i^*$ and $B_i^*$ is reduced, and thereby the circuit quantity of said error pattern generation circuits can be reduced.

5. The burst error detection and correction apparatus according to claim 2 or 3, wherein for a code having a function of correcting a burst error up to b bits, the length w of each frame in the received information is set to 2b, and thereby the circuit quantity for decoding and encoding can be reduced.

6. The burst error detection and correction apparatus according to claim 2 or 3, wherein for a code having a function of correcting a burst error up to b bits and detecting a burst error up to d bits (where d>b), the length w of each frame in the received information and the parity check matrix H is set to (b+d), and thereby the circuit quantity for decoding and encoding can be reduced.

7. A byte error detection and correction apparatus, wherein for a linear code for correcting one byte error where one byte is composed by b bits, the length w of each frame is set to b (i.e., w=b) and the overlap between frames is set to zero in a burst error detection and correction apparatus according to a first apparatus comprising:

a syndrome generation circuit for generating a syndrome S by using a relation $H \cdot D^T$ for received information D having length of n bits and a parity check matrix H having r rows by n columns;

error pattern generation circuits, arranged in parallel, as many as a number of all frames, in which an r-row by (r−w) column matrix $B_i$ is obtained so as to form an r-row by r-column nonsingular matrix Ai by adding to an r-row by w-column partial matrix Hi beginning with an arbitrary ith column and having length of w columns (where w is an integer satisfying a relation b≦w≦2b<r) in the parity check matrix H, an inverse matrix $A_i^{-1}$ of $A_i$=[Hi|Bi] is expressed as $$A_i^{-1} = \left[\frac{H_i^*}{B_i^*}\right],$$

an information frame having length of w bits is formed in the received information, adjacent information frames each having length of w bits is sequentially formed on both sides of the information frame so as to have overlap of (b−1) bits in length, thereby an error having length of b bits occurring in an arbitrary position being able to be included entirely in at least one frame, an r-row by w-column partial matrix $H_i$ beginning with an i-th column and having length of w columns in the matrix H is associated with a certain arbitrary frame beginning with an i-th bit, an error pattern satisfying a relation $e^T = H_i^* \cdot S$ under a condition of $B_i^* \cdot S = 0_{r-w}$ is generated in each of said error pattern generation circuits by using a w-row by r-column matrix Hi* and an (r−w) row by r column matrix $B_i^*$ included in the inverse matrix $A_i^{-1}$ and the syndrome S:

an error pattern calculation circuit for adjusting overlap on outputs of said error pattern generation circuits, which outputs a signal having length of n bits corresponding to the length of n bits of the received information; and an inversion circuit for executing exclusive-OR between the outputs of the error pattern calculation circuit and the received information, and thereby inverting error bits, or according to the first apparatus wherein in a w-row by r-column matrix $H_i^*$ and an (r–row by r-column matrix $B_i^*$ represented by two-value elements "0" and "1" forming an inverse matrix $A_i^{-1}$ of a nonsingular matrix $A_i=[H_i|B_i]$, a number of "1" s in the $Hi^*$ and $B_i^*$ is reduced, and thereby the circuit quantity of said error pattern generation circuits can be reduced, or according to the first apparatus wherein for a code capable of correcting a burst error up to b bits and detecting a burst error up to d bits greater than the b bits, said error pattern generation circuits are formed to correct a burst error up to b bits by setting the length w of each frame equal to an integer value satisfying a relation $b \leq w \leq b+d < r$ and setting the overlap between frames equal to (b−1), and a circuit for outputting "1" when the syndrome is not zero and all outputs of said error pattern calculation circuit are zero is newly provided to detect a burst error up to d bits, and thereby burst errors up to b bits can be corrected and burst errors up to d bits can be detected, and wherein in a w-row by r-column matrix $H_i^*$ and an (r–w)-row by r-column matrix $B_i^*$ represented by two-value elements "0" and "1" forming an inverse matrix $A_i^{-1}$ of a nonsingular matrix $A_i=[H_i|B_i]$, a number of "1" s in the $H_i^*$ and $B_i^*$ is reduced, and thereby the circuit quantity of said error pattern generation circuits can be reduced, and thereby one-byte error can be corrected.

8. A byte error detection and correction apparatus according to claim 7, wherein for a linear code for correcting a one byte error (where one byte is composed by b bits) and for detecting an error exceeding b bits, the length w of each frame is set to b and the overlap between frames is set to zero, and a circuit for outputting "1", when the syndrome is not zero and all outputs of said error pattern calculation circuit are zero is newly provided to detect an error exceeding b bits, and thereby one-byte error can be corrected and error which exceeds b bits can be detected.

* * * * *

UNITED STATES PATENT AND TRADEMARK OFFICE
CERTIFICATE OF CORRECTION

PATENT NO. : 6,990,625 B2 Page 1 of 1
APPLICATION NO. : 10/166642
DATED : January 24, 2006
INVENTOR(S) : Eiji Fujiwara et al.

It is certified that error appears in the above-identified patent and that said Letters Patent is hereby corrected as shown below:

Title Page, Column 1 (Title), Line 3, after "DETECTION" insert --AND--.
Column 5, Line 60, change "Ai" and to --$A_i$--.
Column 6, line 12, change "satisfied." to -- satisfied, --.
Column 6, Line 27, change "Hi" to --$H_i$--.
Column 6, Line 66, change "Hi" to --$H_i$--.
Column 8, Line 33, after "gates" insert -- . --.
Column 10, Line 7, change "Hi*" to --$H_i^*$--.
Column 10, Line 16, after "obtained" insert --. --.
Column 10, Line 46, change "dente" to --denote--.
Column 12, Line 36, after "pattern" insert --,--.
Column 13, Line 21, delete "Hi" and insert -- $H_i$ -- therefor.
Column 13, Line 25, change "[Hi|Bi]" to --$[H_i|B_i]$--.
Column 13, Line 45, change "Hi*" to --$H_i^*$--.
Column 14, Line 38, change "Ai" to --$A_i$ --.
Column 14, Line 39, change "Hi" to --$H_i$ --.
Column 14, Line 43, change "[Hi|Bi]" to --$[H_i|B_i]$--.
Column 14, Line 63, change "Hi*" to --$H_i^*$--.
Column 14, Line 65, after "S" change ":" to --;--.
Column 15, Line 9, change "(r-row" to --(r-w)-row--.
Column 15, Line 12, change "Hi*" to --$H_i^*$--.
Column 16, Line 18, after " "1" " delete ",".

Signed and Sealed this

Fifth Day of June, 2007

JON W. DUDAS
*Director of the United States Patent and Trademark Office*